(12) United States Patent
Fitzgerald et al.

(10) Patent No.: US 9,490,330 B2
(45) Date of Patent: Nov. 8, 2016

(54) CONTROLLING GAASP/SIGE INTERFACES

(71) Applicant: Massachusetts Institute of Technology, Cambridge, MA (US)

(72) Inventors: Eugene A. Fitzgerald, Windham, NH (US); Prithu Sharma, Cambridge, MA (US); Timothy Milakovich, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 14/432,921

(22) PCT Filed: Oct. 4, 2013

(86) PCT No.: PCT/US2013/063450
§ 371 (c)(1),
(2) Date: Apr. 1, 2015

(87) PCT Pub. No.: WO2014/055860
PCT Pub. Date: Apr. 10, 2014

(65) Prior Publication Data
US 2015/0255549 A1    Sep. 10, 2015

Related U.S. Application Data

(60) Provisional application No. 61/710,037, filed on Oct. 5, 2012.

(51) Int. Cl.
*H01L 29/267* (2006.01)
*C30B 29/40* (2006.01)
(Continued)

(52) U.S. Cl.
CPC ........... *H01L 29/267* (2013.01); *C30B 25/183* (2013.01); *C30B 29/40* (2013.01); *H01L 21/0245* (2013.01); *H01L 21/0251* (2013.01); *H01L 21/0262* (2013.01);
(Continued)

(58) Field of Classification Search
CPC . C30B 25/183; C30B 29/40; H01L 29/0603; H01L 29/267
See application file for complete search history.

(56) References Cited

U.S. PATENT DOCUMENTS

| 5,859,864 A | 1/1999 | Jewell |
| 5,877,519 A | 3/1999 | Jewell |

(Continued)

FOREIGN PATENT DOCUMENTS

WO    WO 2012/079113 A1    6/2012

OTHER PUBLICATIONS

Sharma et al., "Controlling Epitaxial $GaA_{sx}P_{1-x}/Si_{1-y}Ge_y$ Heterovalent Interfaces," *ECS Transactions*, 2012, pp. 333-337, vol. 50, No. 9, downloaded Aug. 27, 2013.

(Continued)

*Primary Examiner* — Allan R Wilson
(74) *Attorney, Agent, or Firm* — Wolf, Greenfield & Sacks, P.C.

(57) ABSTRACT

Initiation conditions and strain techniques are described that enable forming high quality GaAsP semiconductor material on an SiGe semiconductor material with low threading defect density. Suitable initiation conditions include exposing the SiGe semiconductor material to a gas comprising arsenic. A tensilely-strained region may be formed in the semiconductor structure between regions of GaAsP semiconductor material and SiGe semiconductor material.

18 Claims, 10 Drawing Sheets

(51) Int. Cl.
  *H01L 21/02* (2006.01)
  *C30B 25/18* (2006.01)
  *H01L 21/223* (2006.01)
  *H01L 29/06* (2006.01)
(52) U.S. Cl.
  CPC .. *H01L 21/02381* (2013.01); *H01L 21/02502* (2013.01); *H01L 21/02543* (2013.01); *H01L 21/02546* (2013.01); *H01L 21/02694* (2013.01); *H01L 21/2233* (2013.01); *H01L 29/0603* (2013.01)

(56) References Cited

U.S. PATENT DOCUMENTS

| | | |
|---|---|---|
| 6,340,788 B1 | 1/2002 | King et al. |
| 8,063,397 B2 | 11/2011 | Mori et al. |
| 2002/0167022 A1 | 11/2002 | Ledentsov |
| 2002/0195599 A1 | 12/2002 | Yu et al. |
| 2007/0054474 A1* | 3/2007 | Tracy ............... H01L 21/02381 438/479 |
| 2007/0137695 A1 | 6/2007 | Fetzer et al. |
| 2008/0149915 A1* | 6/2008 | Mori ................. H01L 33/30 257/13 |
| 2009/0229659 A1 | 9/2009 | Wanlass et al. |
| 2010/0116329 A1 | 5/2010 | Fitzgerald et al. |
| 2010/0116942 A1 | 5/2010 | Fitzgerald et al. |
| 2010/0129956 A1 | 5/2010 | Chang et al. |
| 2010/0221512 A1 | 9/2010 | Lee et al. |
| 2011/0124146 A1 | 5/2011 | Pitera et al. |
| 2011/0254052 A1 | 10/2011 | Kouvetakis et al. |
| 2011/0318893 A1 | 12/2011 | Lochtefeld et al. |
| 2012/0240987 A1* | 9/2012 | King ............... H01L 31/035236 136/255 |
| 2013/0056053 A1 | 3/2013 | Lochtefeld et al. |

OTHER PUBLICATIONS

Carlin et al., "Lattice-Matched GaP/SiGe Virtual Substrates for Low-Dislocation Density GaInP/GaAsP/Si Solar Cells," *IEEE*, 2011, pp. 000918-00921.

Sharma et al., "High Quality Epitaxial Growth of $GaA_{sy}P_{1-y}$ Alloys on $Si_{1-x}Ge_x$ Virtual Substrates," *ECS Transactions*, 2010, pp. 843-848, vol. 33, No. 6, downloaded Dec. 23, 2010.

International Search Report and Written Opinion for International application No. PCT/US2013/063450, mailed Mar. 6, 2014.

* cited by examiner

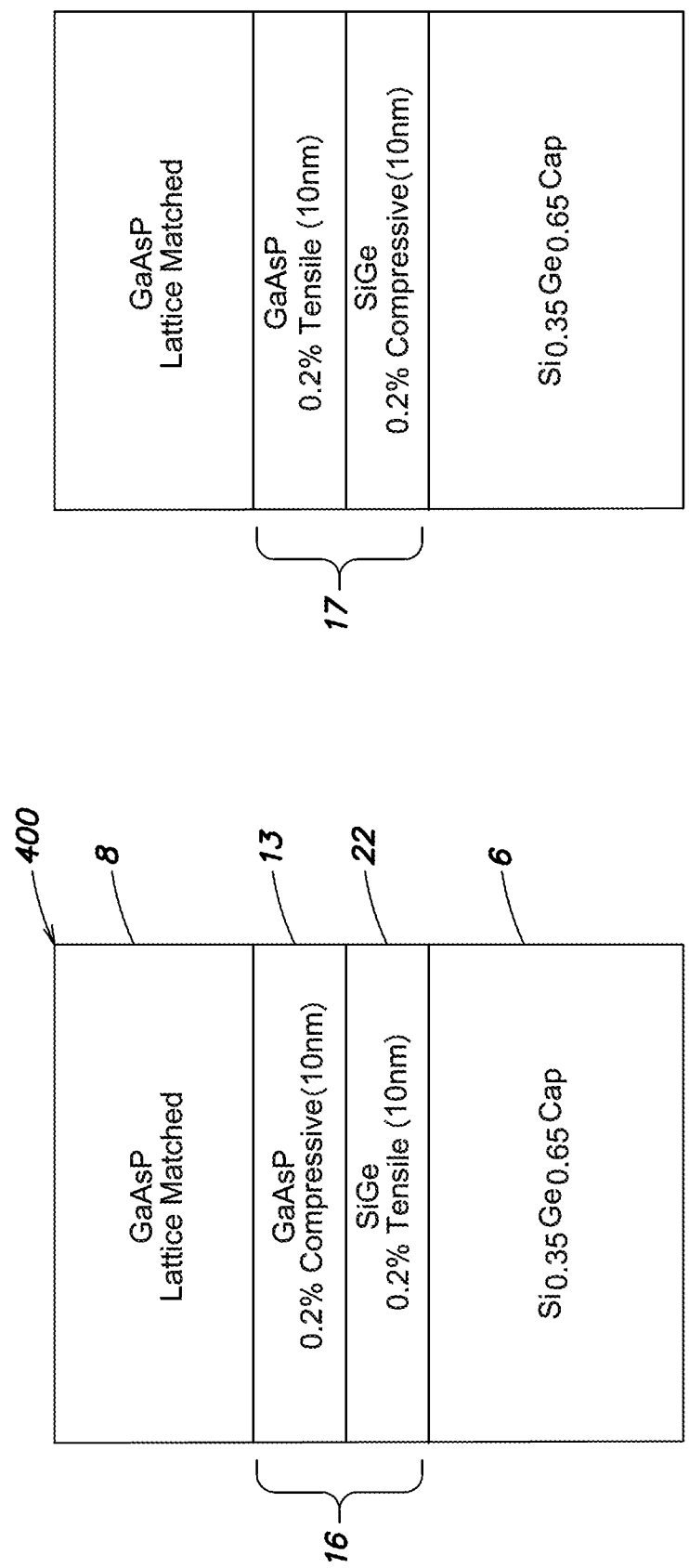

CONTROLLING GAASP/SIGE INTERFACES

CROSS-REFERENCE TO RELATED APPLICATIONS

This application is a U.S. National Stage Application of International Application PCT/US2013/063450 filed Oct. 4, 2013 which claims priority to U.S. provisional application No. 61/710,037, titled "Controlling Epitaxial GaAsP/SiGe Hetervalent Interfaces," filed Oct. 5, 2012, both of which are hereby incorporated by reference in their entirety.

BACKGROUND

1. Field of Invention

The techniques described herein relate to formation of a III-V semiconductor material (e.g., GaAsP) on a group IV semiconductor material (e.g., SiGe). Such techniques enable forming high-quality III-V semiconductor material having a low threading dislocation density suitable for formation of III-V devices.

2. Discussion of the Related Art

Integration of III-V compound thin films on silicon (Si) substrates has received significant attention for many years because of the potential to integrate III-V compound based semiconductor devices (e.g., photovoltaics, lasers, and high-speed transistors) with less expensive and more reliable Si technology. However, when considering the direct deposition of III-V compound materials on Si, challenges lie in the accommodation of lattice mismatch, thermal expansion mismatch and polar-nonpolar interfaces. Any one of these materials integration issues can result in the nucleation of debilitating defect densities.

A very small lattice mismatch (0.37% at 300° K) between gallium phosphide (GaP) and Si makes GaP the most suitable III-V material for direct epitaxial integration on Si. However, previous attempts over the last few decades have shown the presence of defects such as stacking faults (SF) and anti-phase boundaries (APB) in the GaP films. While recent work has indeed produced heteroepitaxially integrated GaP films on Si (100) substrates free of these interface-related defects via a carefully controlled nucleation methodology, such films do not currently possess dislocation densities low enough to enable the desired level of device performance, despite the low degree of lattice mismatch. In contrast, the analogous gallium arsenide/germanium (GaAs/Ge) interface has been demonstrated to be highly controllable, and under the proper conditions, low dislocation density GaAs without APBs and stacking faults can be grown epitaxially on Ge. Work by Sieg, et al. for molecular beam epitaxy (MBE), and Ting, et al. for metal-organic chemical vapor deposition (MOCVD), showed that the use of 6° offcut (100) Ge substrates combined with the proper surface annealing sequence, prior to the initiation of GaAs epitaxy in an appropriate temperature window, could produce reproducible, device-quality GaAs thin films on Ge. In contrast, the extreme sensitivity of the GaP/Si interface over a range of growth conditions tends to generally result in a three-dimensional island morphology with a high density of one or more types of microstructural defects, including stacking faults, threading dislocations and twins. Demonstration of an APB-free $GaAs_yP_{1-y}/Si_{1-x}Ge_x$ interface showed that lattice-matched GaAsP films exhibit a 10×-100× higher threading dislocation density (TDD) due to dislocation nucleation at the heterovalent interface. Also, $GaAs_yP_{1-y}$ TDD increases with increasing P content in the film.

SUMMARY

Some embodiments relate to a semiconductor structure that includes a first semiconductor region comprising a GaAsP semiconductor material. The semiconductor structure also includes a second semiconductor region comprising a SiGe semiconductor material. The semiconductor structure further includes at least one strained semiconductor region between the first semiconductor region and the second semiconductor region. The at least one strained semiconductor region includes a GaAsP and/or a SiGe semiconductor material. The at least one strained semiconductor region comprises a tensilely-strained semiconductor region.

Some embodiments relate to a method of forming a GaAsP semiconductor material on a SiGe semiconductor material. The method includes exposing the SiGe semiconductor material to a gas comprising arsenic. The method also includes forming the GaAsP semiconductor material after exposing the SiGe semiconductor material to the gas comprising arsenic.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

FIGS. 10A-10D show embodiments of semiconductor structures having one or more strained layers.

DETAILED DESCRIPTION

The techniques described herein include initiation conditions and strain techniques that enable controlling dislocation propagation and/or dislocation nucleation at the $GaAs_yP_{1-y}/Si_{1-x}Ge_x$ heterovalent interface. In some embodiments, initiation of growth of a GaAsP semiconductor material on a SiGe semiconductor material may be preceded by exposure of the SiGe semiconductor material to a gas comprising arsenic, such as $AsH_3$. Such an initiation technique can inhibit the nucleation of defects, as discussed below. In some embodiments, the nucleation and/or propagation of defects can be suppressed by the inclusion of a strained region, such as a tensiley-strained region of GaAsP semiconductor material or SiGe semiconductor material between regions of relaxed SiGe semiconductor material and GaAsP semiconductor material. Through use of such initiation and/or strain techniques, a III-V material having a threading dislocation density of $10^6/cm^2$ or lower can be formed on an Si wafer. Such techniques enable III-V integration on silicon for lattice-constants in the III-V materials system near that of the silicon lattice constant.

Figure 1:
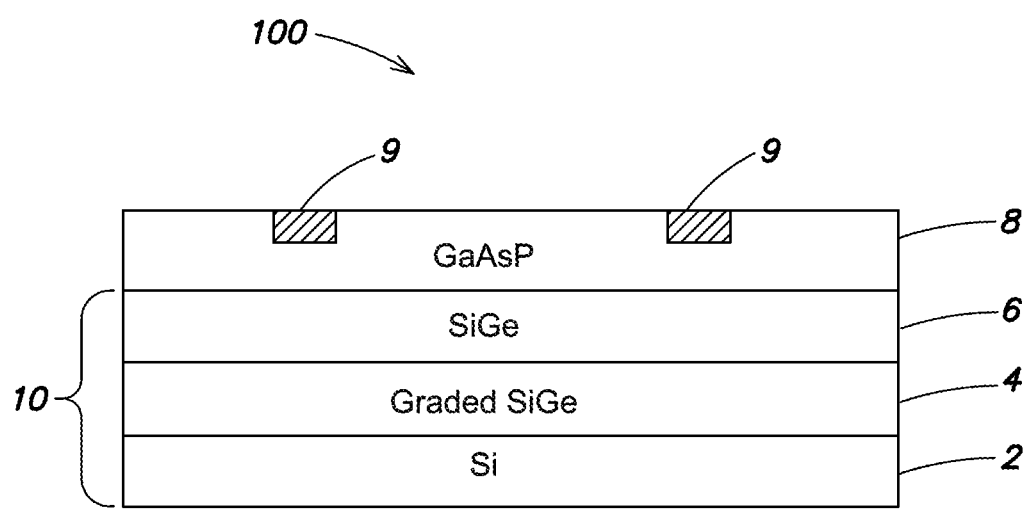
FIG. 1 shows a semiconductor structure in which GaAsP is formed on SiGe over a silicon substrate.

FIG. 1 shows a semiconductor structure 100 in which a region of GaAsP semiconductor material 8 is formed over a silicon substrate 2 (e.g., a silicon wafer) through the use of suitable intermediate layers. Electronic and/or optoelectronic devices 9 may be formed in and/or over the region of GaAsP semiconductor material 9. A region of compositionally graded SiGe semiconductor material 4 may be formed on the silicon substrate 2 (e.g., by epitaxial growth). Region 4 may have a high silicon composition near its interface with silicon substrate 2, and the composition may be graded over the thickness of region 4 such that its composition includes an increasing proportion of germanium with increasing distance from the silicon substrate 2. The compositional grading of region 4 gradually changes the lattice constant of region 4 from that of silicon to that of a GaAsP semiconductor material. A lattice-matched substrate suitable for growth of a III-V semiconductor material (e.g., GaAsP) is thereby produced. Such a substrate is referred to herein as a "virtual substrate," and is shown in FIG. 1 by reference character 10. The formation of a lattice-matched virtual substrate can provide a suitable platform for growth of a III-V semiconductor material by avoiding defects that would be introduced as a result of a lattice mismatch. Following formation of the region of compositionally graded SiGe semiconductor material 4, a region of SiGe semiconductor material 6 may be formed on the region 4 as a "cap layer" of an SiGe semiconductor material with a surface suitable for growth of a region of GaAsP semiconductor material 8 thereon. In semiconductor structure 100 of FIG. 1, region 8 is lattice matched to region 6 to minimize defect formation. However, as discussed below, the present inventors have observed that region 8 of GaAsP semiconductor material nonetheless may have a high defect density if conditions for growth initiation and/or structural conditions of semiconductor structure 100 are not carefully controlled. Suitable initiation and structural conditions for minimizing defects are described herein.

In some embodiments, silicon substrate 2 may be a (100) silicon substrate with a 4-6° offcut towards the nearest {111} plane. As an example, the offcut may be 6°. The use of a suitable offcut can provide, with proper substrate annealing, a step structure that suppresses and eliminates anti-phase disorder detrimental to material quality, during the growth of III-V compounds on group IV semiconductors.

An example of a process for forming a III-V semiconductor material on a group IV semiconductor material will now be described. Prior to the growth of semiconductor region 4 on silicon substrate 2, the silicon substrate 2 may be chemically cleaned using a 10 minute piranha clean (3:1 $H_2SO_4:H_2O_2$) followed by a 1 minute HF dip (10:1 $H_2O$: HF), which produces a clean, hydrogen-terminated surface.

In some embodiments, the SiGe semiconductor material of region 4 may be grown on the silicon substrate 2 using an epitaxial growth technique. As an example, the growth of SiGe may be performed in an ultra-high vacuum chemical vapor deposition (UHVCVD) reactor at a nominal growth pressure of 25 mTorr. The growth may be performed at 900° C. with $SiH_4$ and $GeH_4$ precursors. Growth may begin with the formation of a homoepitaxial Si layer (not shown). After the growth of the homoepitaxial Si layer, $Si_xGe_{1-x}$ may be formed and compositionally graded at a rate of $\Delta x_{Ge}=0.10/\mu m$ to $Si_{0.5}Ge_{0.5}$ or another SiGe semiconductor material with a suitable composition. Region 4 may be capped with a cap layer 6 of SiGe semiconductor material. For example, the cap layer may include a 1.5 μm thick, fully-relaxed (unstrained) $Si_{0.5}Ge_{0.5}$ layer. The wafer may then be polished and planarized through chemical-mechanical polishing (CMP). It should be appreciated that $Si_{0.5}Ge_{0.5}$ is only one example of an SiGe semiconductor material, as region 4, 6 may have any suitable composition with different proportion of Si and Ge. In some embodiments, region 6 and/or the upper portion of region 4 may include at least 5% Si and at least 5% Ge (e.g., $Si_xGe_{1-x}$, in which $0.05 \leq x \leq 0.95$).

Subsequent deposition may be performed in a close-coupled showerhead MOCVD reactor, which has the ability to grow III-V compounds as well as group IV semiconductors. All growths for this phase may be performed at 100 Torr using $N_2/H_2$ carrier gas with $SiH_4$, $GeH_4$, $AsH_3$, $PH_3$ and tri-methyl gallium (TMGa) as precursors for the Si, Ge, As, P and Ga, respectively. Before loading the SiGe virtual substrate into the MOCVD reactor, it may be chemically cleaned (e.g., with the procedure noted earlier). Prior to initiation of epitaxy, the SiGe virtual substrate may be annealed in the reactor at 825° C. in $N_2$ for 10 minutes to drive off any moisture from the surface and desorb any native oxide. SiGe may be homo-epitaxially grown at 825° C. under an $H_2$ ambient to bury any remaining contaminants and to provide a pristine surface for subsequent growth. If necessary, further compositional grading of $Si_{1-x}Ge_x$ may be carried out at 750° C. under $H_2$, after which the wafer may be annealed under a $N_2$ ambient in order to obtain a double-stepped surface. $N_2$ may be used to prevent any potential etching of the $Si_{1-x}Ge_x$ that could ensue at an elevated temperature due to the presence of $H_2$. The substrate then may be quenched to the GaAsP nucleation temperature, locking in the surface step structure.

Growth of lattice-matched $GaAs_yP_{1-y}$ for region 8 may be initiated on the $Si_{1-x}Ge_x$ at 725° C. with a relatively high V/III ratio (257) with a low TMG flow to grow a thin (100 nm) nucleation layer at a slow growth rate, after which the V/III ratio may be reduced (TMGa flow increased) to 102 for the remainder of the film growth in order to grow at a faster rate. After the $GaAs_yP_{1-y}$ growth, region 8 may be capped with a very thin (10 Å) strained GaAs layer or lattice-matched $In_zGa_{1-z}P$ layer so as to prevent post-growth surface roughening due to uncontrolled non-stoichiometric depletion of As and P species as the wafer cools to room temperature.

Post-growth analysis of the films described herein has been performed using plan-view and cross-sectional transmission electron microscopy (PVTEM and XTEM), x-ray diffraction (XRD) and atomic force microscopy (AFM).

Initiation Conditions

Because of the high dislocation density produced in GaAs$_y$P$_{1-y}$ films without controlled nucleation, a series of experiments was performed with different initiation sequences on Si$_{0.35}$Ge$_{0.65}$ virtual substrates before a heteroepitaxial film was grown. The Si$_{0.35}$Ge$_{0.65}$ layer was exposed to different precursors (TMGa, AsH$_3$ and PH$_3$) for various durations before growing the GaAs$_y$P$_{1-y}$ layer at 725° C. This is summarized in Table 1.

TABLE 1

Initiation Condition Experiments: GaAsP on SiGe65

| | Initiation Sequence | | | | |
|---|---|---|---|---|---|
| | PH$_3$ | AsH$_3$ + PH$_3$ | TMGa + AsH$_3$ + PH$_3$ | AsH$_3$ | AsH$_3$ |
| Time | 3 sec | 3 sec | — | 3 sec | 10 sec |

Figure 2:
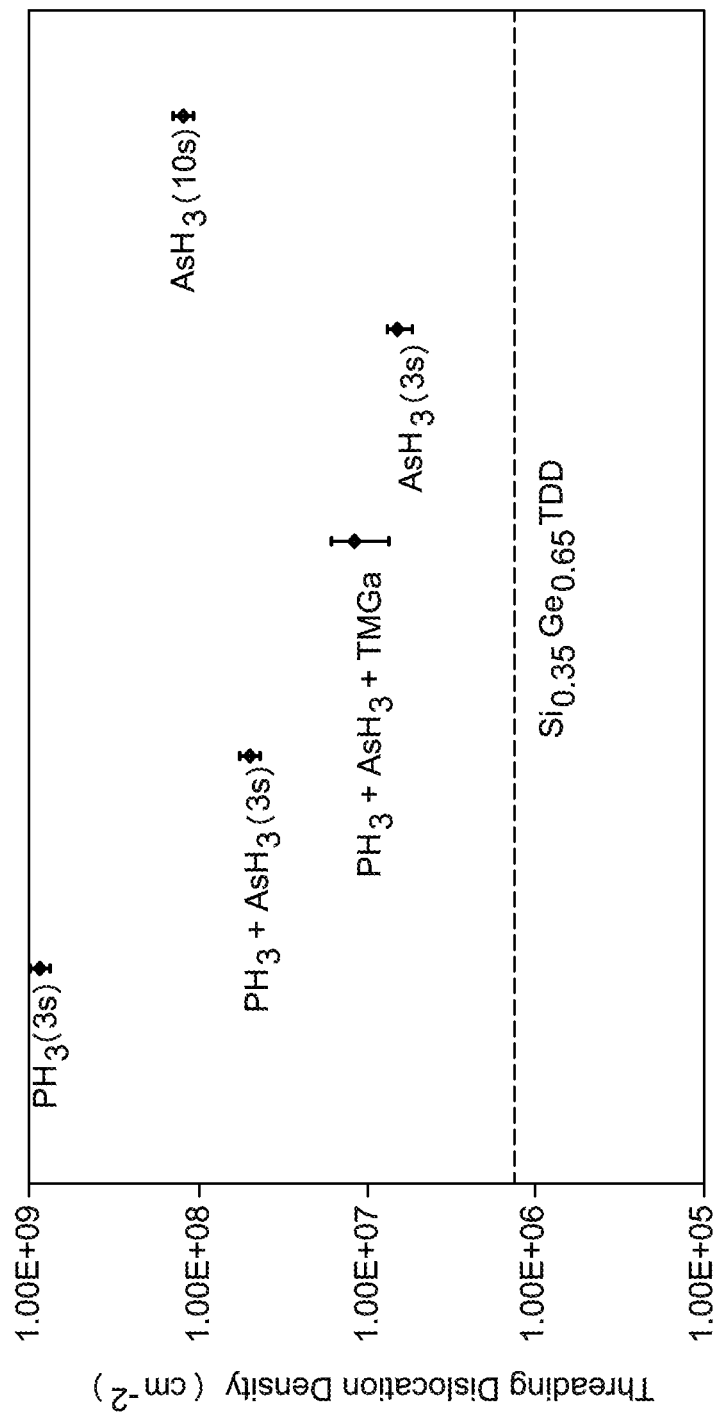
FIG. 2 shows a plot of the threading dislocation density in GaAsP formed on SiGe using different initiation conditions.

FIG. 2 shows a plot of the threading dislocation density in GaAsP on SiGe using different initiation conditions. Analysis through XTEM and PVTEM reveals that the best quality GaAsP material was obtained when the surface of the SiGe material was exposed to AsH$_3$ for three seconds at 725° C., as shown in FIG. 2. Exposure to a gas comprising arsenic (e.g., AsH$_3$) produced fewer defects than exposure to PH$_3$. Exposure to PH$_3$ for three seconds resulted in a heavily defective GaAs$_y$P$_{1-y}$ film. This can be attributed to the reaction between Si and P at the heterovalent interface, which is difficult to avoid because of the high reactivity between the elements. The interaction between Si and P disrupts the double-stepped surface of underlying substrate, which is problematic because the double-stepped surface may assist in the prevention of the formation of APD. The effect of Si and P interaction becomes less profound as the fraction of PH$_3$ in the reactor decreases, which is seen as the initiation condition shifts from only PH$_3$ to PH$_3$+AsH$_3$ and finally to only AsH$_3$ initiation.

With a moderate exposure to AsH$_3$ (three seconds), a thin layer of the precursor adsorbs to the SiGe surface. The adsorbed layer helps prevent the underlying silicon from interacting with PH$_3$. When TMGa and PH$_3$ are introduced to the chamber along with the already flowing AsH$_3$, the PH$_3$ reacts with the metal organic rather than the Si, thereby reducing the formation of unwanted surface morphology. This ultimately improves the quality of the GaAsP semiconductor material and reduces the threading dislocation density.

While a moderate exposure to AsH$_3$ prior to film growth greatly improved the GaAs$_y$P$_{1-y}$ quality, prolonged exposure to AsH$_3$ increased the threading dislocation density in the film. The interface quality exhibited defects at the interface and a high TDD when exposed to 10 seconds of AsH$_3$ prior to the film growth. It has been reported that prolonged exposure to AsH$_3$ etches the Si surface, which may prevent the surface from maintaining a desirable double atomic step height. It was noticed that prolonged exposure to AsH$_3$ and presence of any PH$_3$ before the growth deteriorates the film quality.

Our findings show that three seconds of exposure with AsH$_3$ is sufficient to prevent any reaction between Si and P, and is also not long enough to start etching the SiGe surface. From our experiments it was found that the optimal sequence for initiation is exposing the SiGe surface to three seconds of AsH$_3$ before growing the III-V film. For all the experiments described below this initiation sequence was used. However, the techniques described herein are not limited to a three second exposure. In some embodiments, exposure to a gas comprising arsenic (e.g., AsH$_3$) may be performed for a period of 2-4 seconds or 1.5-5 seconds. In some embodiments, a shorter or longer exposure may be performed.

Strain Conditions

Figure 3A:
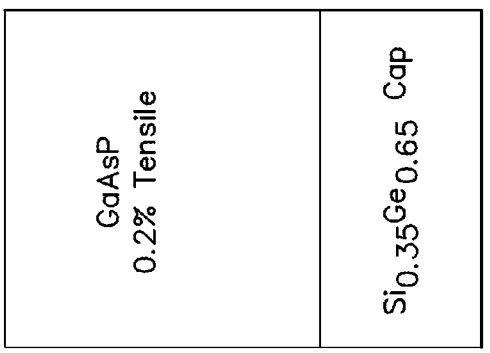
FIGS. 3A, 3B, and 3C show structures having regions of $GaAs_yP_{1-y}$ that are 0.2% tensile, lattice-matched and 0.2% compressively strained, respectively, with respect to underlying SiGe.
Figure 3B:
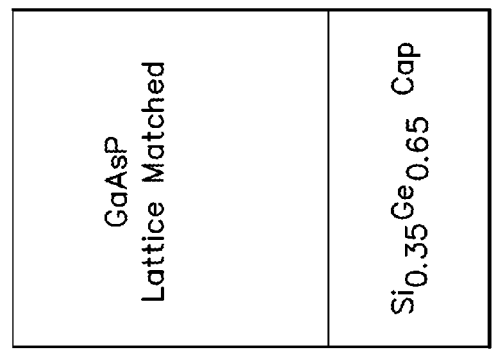
Figure 3C:
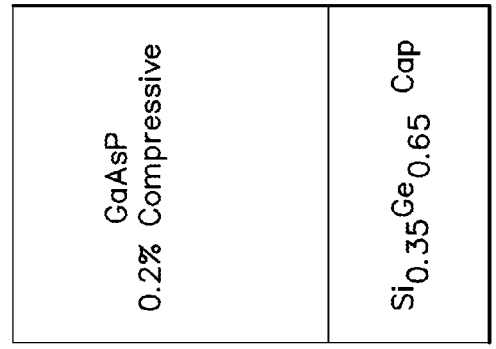

To understand the effect of strain at the interface on the defect density in GaAs$_y$P$_{1-y}$, GaAs$_y$P$_{1-y}$ was epitaxially grown on Si$_{1-x}$Ge$_x$ virtual substrates with different strain conditions. As shown in FIGS. 3A, 3B, and 3C, GaAsP was formed that was 0.2% tensilely-strained, lattice-matched, and 0.2% compressively strained, respectively, on underlying Si$_{0.35}$Ge$_{0.65}$. The GaAs$_y$P$_{1-y}$ films were grown at 725° C. with a three second AsH$_3$ initiation before PH$_3$ and TMGa were introduced. The same experiments were repeated on Si$_{0.15}$Ge$_{0.85}$ virtual substrates at 650° C. with a three second AsH$_3$+PH$_3$ initiation before TMGa was introduced. As previously mentioned, GaP/Si initiation is the most problematic, whereas GaAs/Ge is the most tolerant, and therefore a Ge concentration of 85% is expected to be more tolerant than the 65% Ge at the interface, but less tolerant than GaAs/Ge.

Note that 0.2% strain is a very small amount of strain for typical lattice-mismatched epitaxy. In systems with zinc-blende/zinc-blende interfaces or diamond cubic/diamond cubic interfaces (i.e., homovalent), this level of strain does not produce a high density of threading dislocations in the film. Therefore, one would expect little effect on the quality of the GaAsP in these films.

Figure 3D:
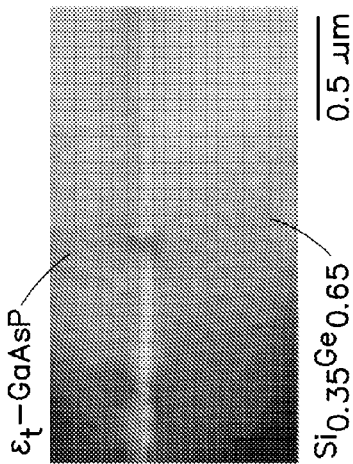
FIGS. 3D, 3E and 3F show cross-sectional <220> bright field TEM images of 0.2% tensilely-strained, lattice-matched and 0.2% compressively-strained GaAsP, respectively, on SiGe.
Figure 3E:
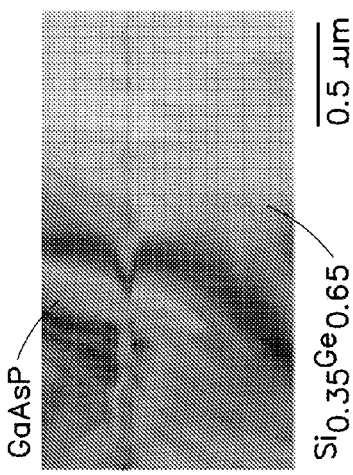
Figure 3F:
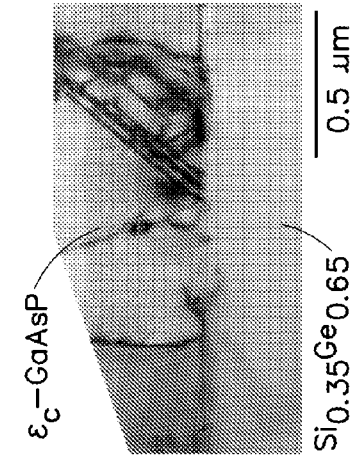
Figure 4A:
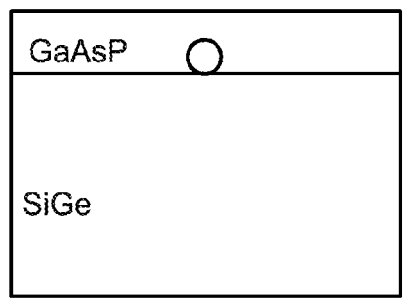
FIGS. 4A, 4B and 4C show diagrams illustrating a mechanism for dislocation loop nucleation, expansion and threading dislocation formation, respectively.
Figure 4B:
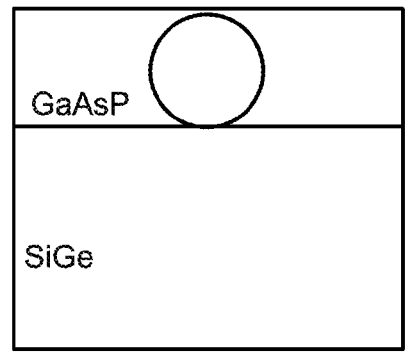
Figure 4C:
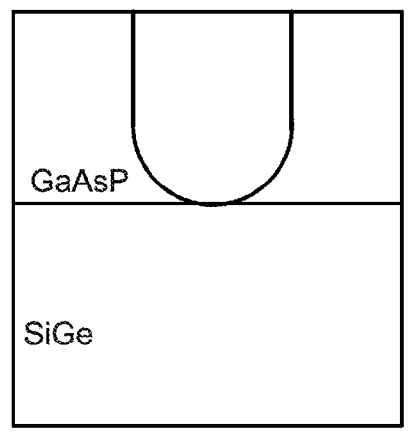
Figure 5A:
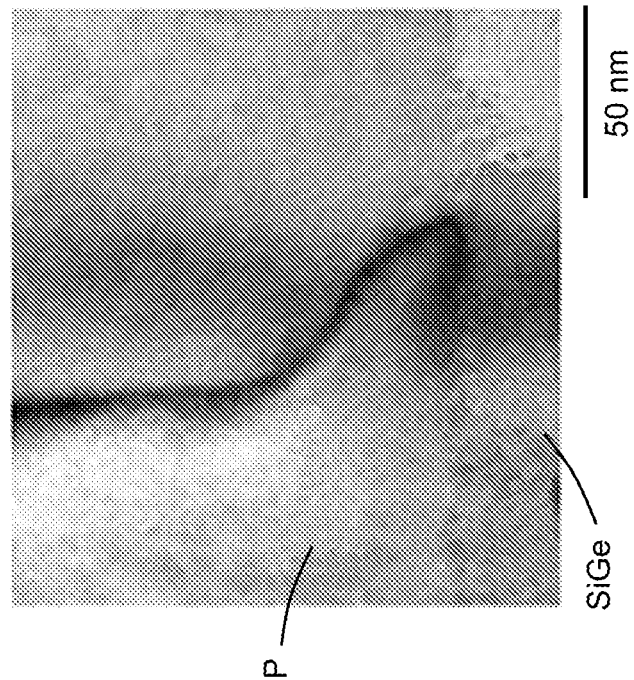
FIG. 5A shows an image of a dislocation loop at the GaAsP/SiGe interface.
Figure 5B:
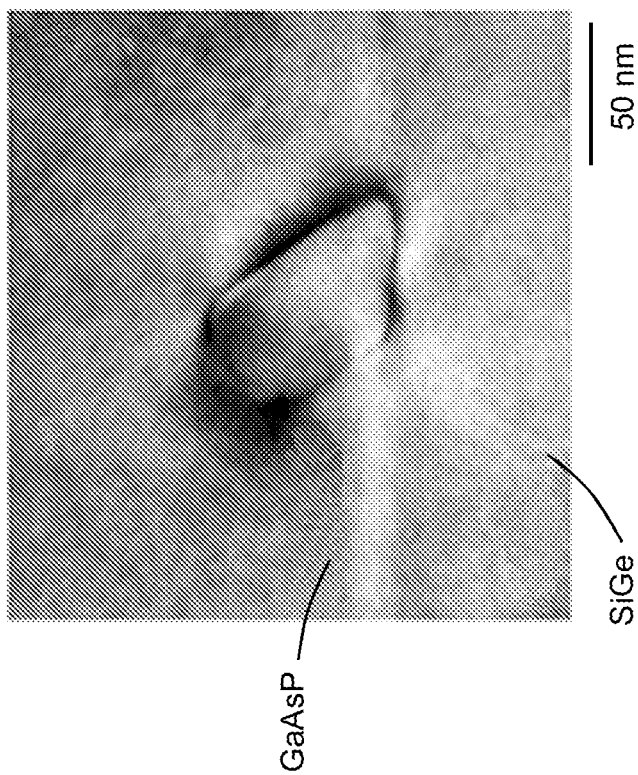
FIG. 5B shows an image of a dislocation half loop at the GaAsP/SiGe interface.

FIGS. 3D, 3E and 3F show cross-sectional <220> bright field TEM images of 0.2% tensilely-strained, lattice-matched and 0.2% compressively-strained GaAsP, respectively, on 65% Ge composition SiGe virtual substrates. Surprisingly, a 0.2% compressively stressed GaAs$_{0.68}$P$_{0.32}$ film deposited on Si$_{0.35}$Ge$_{0.65}$ exhibits a high value of $10^9$ cm$^{-2}$ TDD in stark contrast to the lattice matched and 0.2% tensile strained films, which exhibited $10^6$ cm$^{-2}$ TDD. Thus, a small amount of lattice-mismatch at the interface can result in very low yield because of the drastic increase in defect density that occurs if the interface is just slightly mismatched compressively. Both of the strained films were grown beyond their critical thickness. Any relative increase in threading dislocation density caused by relaxing the thin film should be seen equally for both signs of strain. To explain the vastly different threading dislocation densities in the GaAs$_y$P$_{1-y}$ films, we propose that an elevated level of point defects accumulates at a compressively strained GaAs$_y$P$_{1-y}$/Si$_{1-x}$Ge$_x$ interface, which condense and form dislocation loops. The loops then expand and lead to high TDD. FIGS. 4A-4C show diagrams illustrating a mechanism for dislocation loop nucleation, expansion and threading dislocation formation, respectively. FIG. 5A shows an image of a dislocation loop at the GaAsP/SiGe interface. FIG. 5B shows an image of a dislocation half loop at the GaAsP/SiGe interface.

Conversely, a tensile strained interface repels vacancies and hinders the condensation of the point defects at the GaAs$_y$P$_{1-y}$/Si$_{1-x}$Ge$_x$ interface. Similar results were observed for the GaAs$_y$P$_{1-y}$/Si$_{0.15}$Ge$_{0.85}$ interface experiments, where the dislocation density increases in the case of a compressively strained GaAs$_y$P$_{1-y}$ film, even though this interface is very close in composition to the GaAs/Ge interface. These results indicate that tensile strain is better for the $GaAs_yP_{1-y}/Si_{1-x}Ge_x$ heterovalent interface, whereas compressive films lead to dislocation nucleation. This is further substantiated by the interface quality of the following two systems; GaAs/Ge and GaP/Si. While GaAs films have 0.8% tensile strain with respect to the underlying Ge substrate, GaP films are 0.37% compressively strained with respect to Si at 300° K. The GaAs/Ge system has a very broad process window, which results in a high quality interface. Even though the GaP/Si system is similar to GaAs/Ge, defects have proven difficult to control at this interface. However $Si_{0.88}Ge_{0.12}$ virtual substrates grown on Si provide an excellent lattice-matched template for GaP epitaxy. GaP grown on lattice matched $Si_{0.88}Ge_{0.12}$ exhibits an improvement in the TDD by almost an order of magnitude as compared to direct integration of GaP on Si.

The driving force for point defect condensation is a super saturation of these defects above the equilibrium concentration. Point defects of interest at the $GaAs_yP_{1-y}/Si_{1-x}Ge_x$ interface are interstitial atoms and vacancies. Under a strain state of compression, vacancies are more thermodynamically favored; conversely under a strain state of tension vacancies are thermodynamically unfavorable. Interstitial atoms exhibit an inverse relation to strain compared to vacancies. If an excess of vacancies were the source of point defect condensation into dislocation loops, we would expect to see a reduction of loops and thereby threading dislocation density in a tensile strained interface and an increase for a compressively strained interface. This trend is readily observed in the strain study described above.

Figure 6:
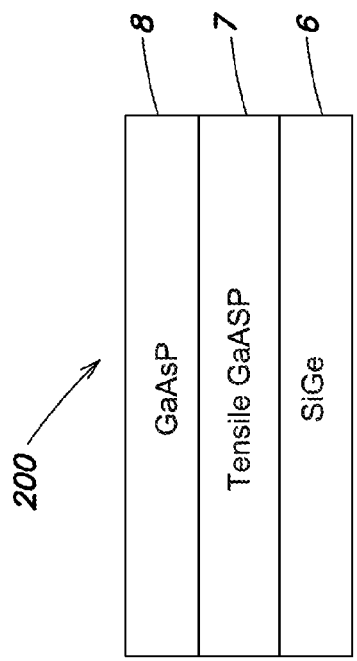
FIG. 6 shows a semiconductor structure including a tensilely-strained semiconductor region between regions of GaAsP and SiGe semiconductor material.

In view of the results obtained in the structures shown in FIGS. 3A and 3D with the introduction of tensile strain, FIG. 6 shows an embodiment of a semiconductor structure 200 having a tensilely-strained semiconductor region 7. Semiconductor structure 200 includes a region of SiGe semiconductor material 6 and a region of GaAsP semiconductor material 8. A tensilely-strained semiconductor region of GaAsP semiconductor material 7 is formed between regions 6 and 8. As discussed above, the tensilely-strained region of GaAsP 7 may be tensilely-strained with a strain of 0.2%. However, the techniques described herein are not limited to a strain of 0.2%. In some embodiments, the strain of region 7 may be 0.1% to 0.3%, 0.1% to 0.5%, or 0.1% to 1%. In some embodiments, the strain may be smaller or larger than these values. In some embodiments, the average strain of region 7 across the wafer may be 0.2%, 0.1% to 0.3%, 0.1% to 0.5%, or 0.1% to 1%. In some embodiments, region 7 may have a thickness along the direction extending between regions 6 and 8 of less than a critical thickness for defect formation. For a given strain, region 7 will begin to develop defects if grown beyond its critical thickness. The determination of the critical thickness for region 7 is understood by those of ordinary skill in the art.

Closer examination of the heterovalent interface shows that threading dislocations do not glide far from the loop nucleation event at the interface that produced them. This behavior is consistent with the low degree of mismatch; nucleation occurs, but there is a relatively low driving force for glide. It is likely that the loops condense when the film is very thin, and the image force on the part of the loop closer to the surface pulls the upper part of the loop to the surface, resulting in two threading dislocations when the film is below the critical thickness. Thus, the threads do not glide as there is not yet a large enough over-stress. As the film passes through the critical thickness, there is an abundance of threading dislocations due to this interface nucleation mechanism. Therefore, only a fraction of these threading dislocations need to glide a short distance to produce enough misfit to relieve the strain. Many of the threading dislocations will remain near their nucleation events.

The origin of the point defects at the interface is likely due to an imbalance in the interdiffusion of group III, V and IV species across the heterovalent interface. The high concentration of point defects then condenses and form dislocation loops when the film is thin.

With this knowledge in hand, we discovered that using strain to compensate for this nucleation event in different ways could improve the quality of the $GaAs_yP_{1-y}$ film. In one case, thin strained regions of $GaAs_yP_{1-y}$ above the $GaAs_yP_{1-y}/Si_{1-x}Ge_x$ interface were introduced as a means to prevent the dislocation loops at the interface from expanding into threading dislocations.

Figure 7:
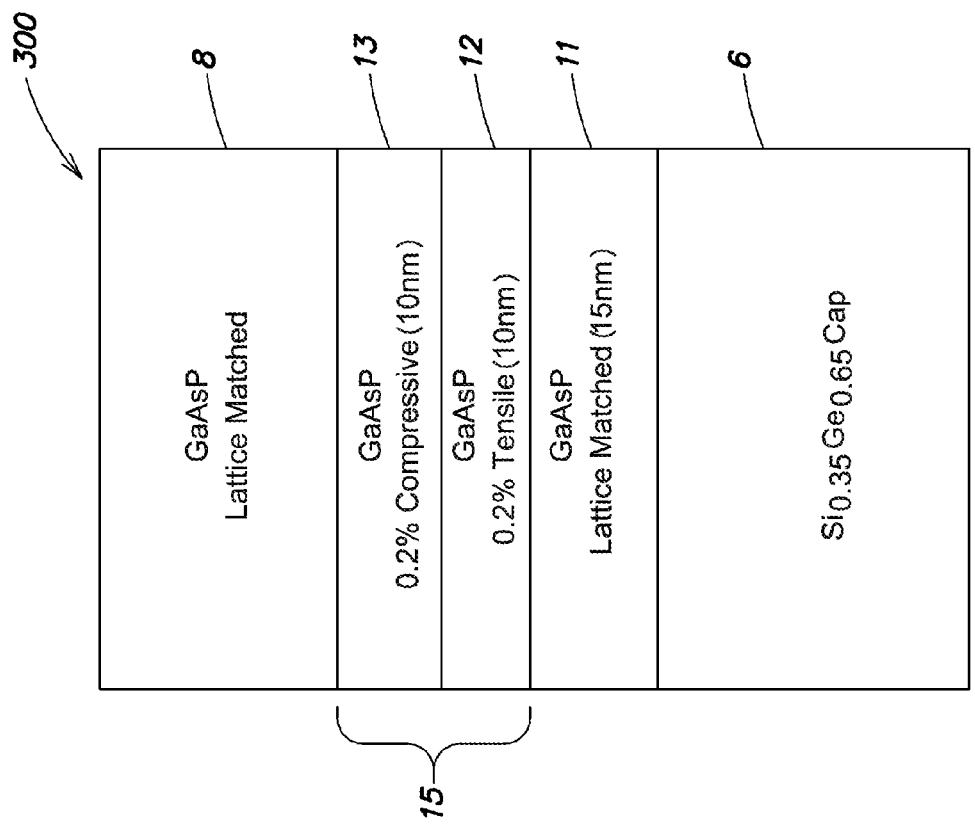
FIG. 7 is a diagram of a "loop-trapping" structure with a thin tensile-compressive (t-c) zone.

FIG. 7 is a diagram of a "loop-trapping" structure 300 with a thin tensile-compressive (t-c) zone 15, according to some embodiments. A 15 nm thick lattice-matched region of GaAsP material 11 (lattice matched to SiGe region 6) was initiated and grown as described above, followed by growth of a thin tensile-compressive zone 15 including a 0.2% tensilely-strained region of GaAsP material 12 and a 0.2% compressively-strained region of GaAsP material 13, before further continuing with a lattice-matched region of GaAsP semiconductor material 8 (lattice matched to SiGe region 6). The 0.2% tensile and compressive regions were 10 nm in thickness, which is below the critical thickness for this amount of mismatch. The tensilely-strained-region 12 was inserted to prevent the dislocation loops present at the heterovalent interface from expanding to the surface and creating threading dislocation segments that are permanently frozen in the film. The purpose of the compressive region 13 was to compensate for the strain introduced from the tensile layer.

The techniques described herein are not limited to a strain of 0.2% in regions 12 and 13. In some embodiments, the strain of regions 12 and 13 may be 0.1% to 0.3%, 0.1% to 0.5% or 0.1% to 1%. In some embodiments, the strain may be smaller or larger than these values. In some embodiments, the average strain of a regions 12 or 13 across the wafer may be 0.2%, 0.1% to 0.3%, 0.1% to 0.5% or 0.1% to 1%. Further, the techniques described herein are not limited to particular thickness for the regions shown in FIG. 7, although regions 12 and 13 may have thicknesses below the critical thickness.

Figure 8:
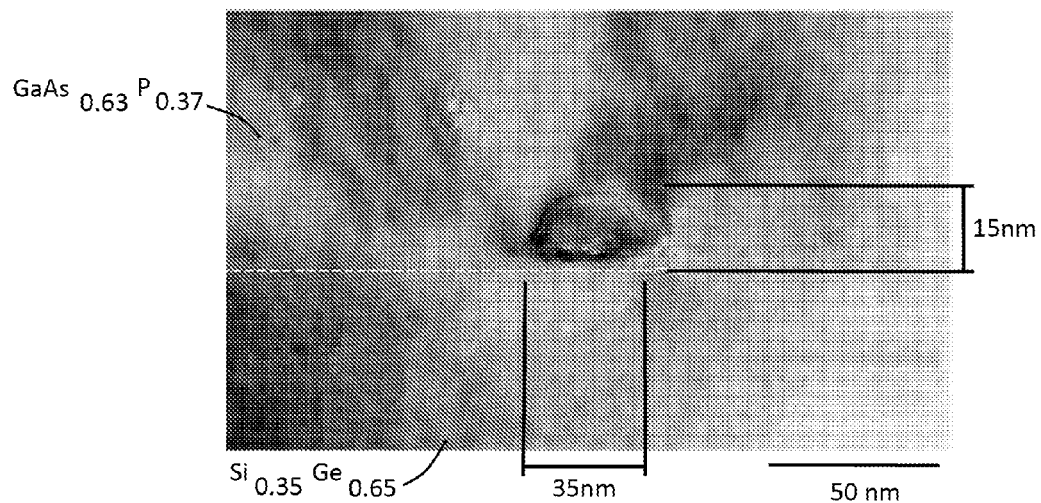
FIG. 8 shows an image of a trapped dislocation loop at the GaAsP/SiGe interface.
Figure 9:
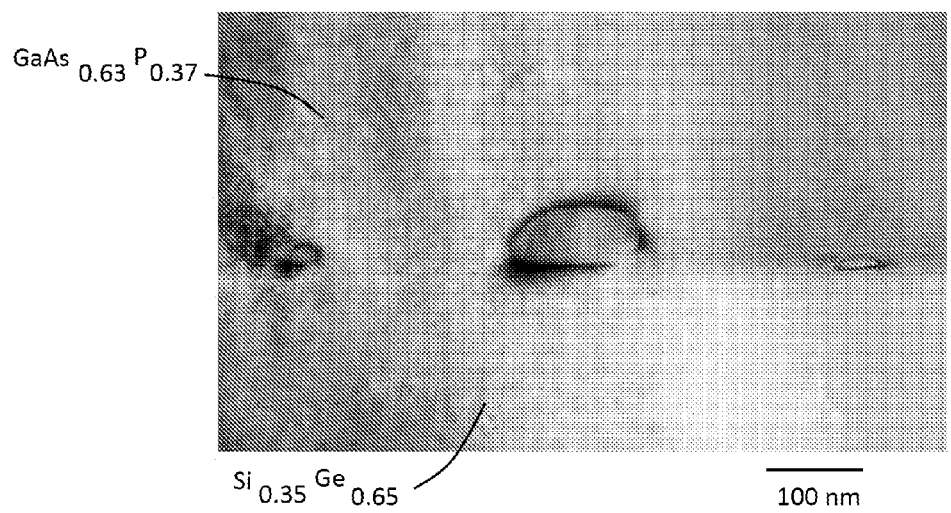
FIG. 9 shows dislocation loops of different heights at the GaAsP/SiGe interface.
Figure 11:
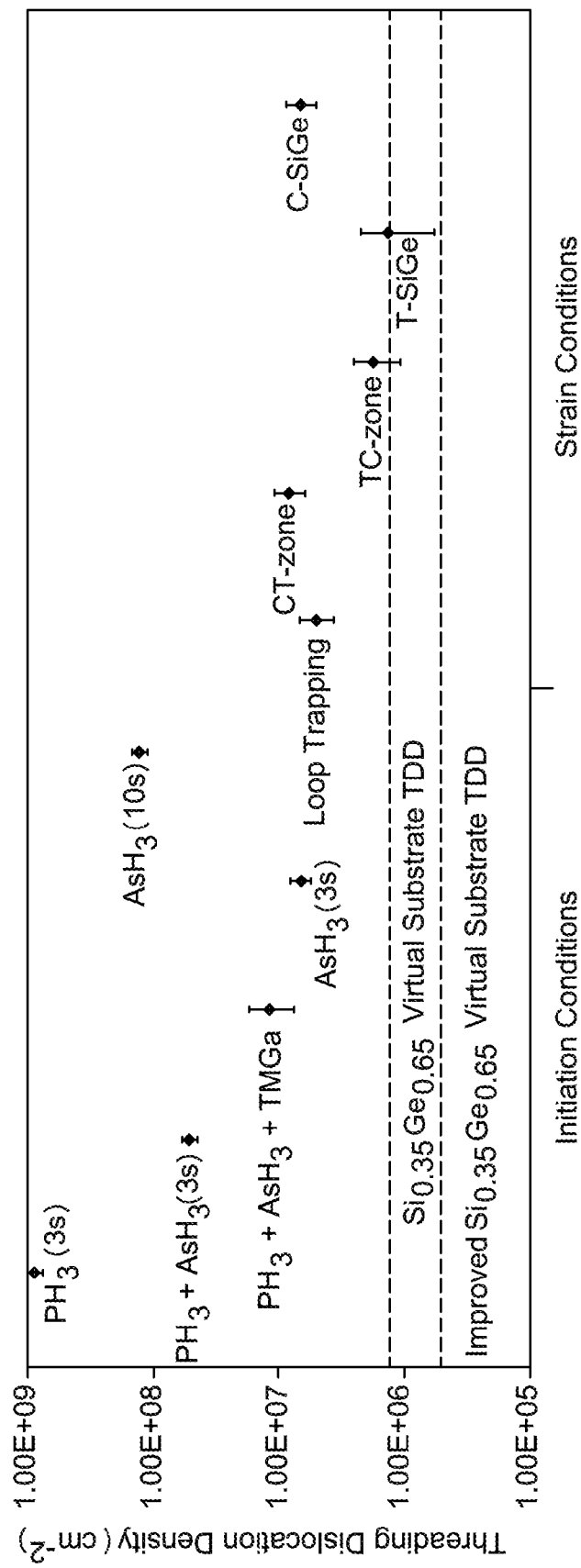
FIG. 11 shows a plot illustrating the TDD obtained based on use of the initiation conditions and the strain engineering experiments described herein.

From the XTEM images of this sample, closed loops were observed at the heterovalent interface. FIG. 8 shows an image of a trapped dislocation loop at the GaAsP/SiGe interface. Many of the loops have a height of 15 nm, which corresponds to the thickness of the lattice-matched layer under the strained zone, confirming that the loop was prevented from expanding by the strained zone. FIG. 9 shows dislocation loops of different heights at the GaAsP/SiGe interface. The loops observed in XTEM have flat features at the top, further indicating that the zone formed a barrier inhibiting the expansion of the loops; however some of the loops observed at the interface had expanded to a height of 60 nm (FIG. 9), suggesting that more strain and/or thickness would improve the film even further. These loops were also visible in the PVTEM images of the sample and the dimensions matched with those seen through XTEM. The strained zone was effective in containing the loops at the interface as many were prevented from expanding. The threading dislocation density in the strained zone sample was slightly lower than the conventional lattice-matched film sample as shown in FIG. 11 (with the result labeled "Loop Trapping" resulting in slightly lower TDD than the use of AsH$_3$ initiation alone).

Because excessive vacancy concentration at the interface leads to an increase in the threading dislocation density, minimizing their concentration or suppressing their formation should improve the material quality even further. From the previous experiment, we see that strain is a viable parameter for affecting the interface quality. We therefore have several parameters that can be tested: tension or compression at the interface on the films side, and tension or compression on the substrate side. The underlying $Si_{1-x}Ge_x$ virtual substrate can be completed with a slightly strained layer after which $GaAs_yP_{1-y}$ can be initiated with a strained layer. With the success in preventing the dislocation loops from expanding, attempts were made to suppress the loop nucleation at the interface.

FIGS. 10A-10D show diagrams of semiconductor structures grown to test suppression of dislocation loop nucleation, according to some embodiments.

In the semiconductor structure 400 shown in FIG. 10A, the tensile-compressive zone used in the loop trapping experiment was moved onto the interface as a tensile-compressive zone 16. Semiconductor structure 400 includes a region of SiGe semiconductor material 6, a tensilely-strained region of SiGe semiconductor material 22, a compressively-strained region of GaAsP semiconductor material 13, and a region of GaAsP semiconductor material 8. Plan view TEM data reveals that the threading dislocation density of the $GaAs_yP_{1-y}$ film was equal to the threading dislocation density of the underlying SiGe virtual substrate (see FIG. 11, with the result labeled "TC-zone"). Since the threading dislocation density did not increase at the heterovalent interface, the t-c zone has been shown to prevent dislocation nucleation.

The techniques described herein are not limited to a strain of 0.2% in regions 22 and 13. In some embodiments, the strain of regions 22 and 13 may be 0.1% to 0.3%, 0.1% to 0.5% or 0.1% to 1%. In some embodiments, the strain may be smaller or larger than these values. In some embodiments, the average strain of regions 22 and 13 across the wafer may be 0.2%, 0.1% to 0.3%, 0.1% to 0.5% or 0.1% to 1%. Further, the techniques described herein are not limited as to particular thickness for the regions shown in FIG. 10A. Strained regions 22 and 13 may have a thickness smaller than the critical thickness for defect formation. Further, any suitable compositions of SiGe semiconductor material and GaAsP semiconductor material may be used.

However the use of a compressive-tensile (c-t) zone 17 (compression on the $Si_{1-x}Ge_x$-side and tension on the $GaAs_yP_{1-y}$-side, as shown in the structure of FIG. 10B) at the interface resulted in dislocation nucleation at the interface and led to high TDD (see FIG. 11, with the result labeled "CT-zone"). Thus, in some embodiments, forming a tensile layer under any compressive layer may result in lower TDD.

Figure 10D:
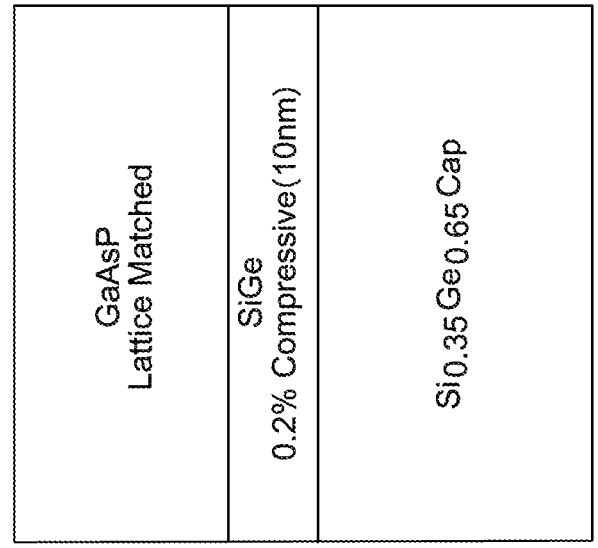

The last set of experiments (producing the structures shown in FIGS. 10C and 10D) examined the necessity of the paired strain layer at the interface and if solely straining the $Si_{1-x}Ge_x$ layer under the $GaAs_yP_{1-y}$ was enough to suppress defect nucleation. Lattice matched $GaAs_yP_{1-y}$ was grown on $Si_{0.35}Ge_{0.65}$ virtual substrates that were terminated with either a tensile strained layer (FIG. 10C) or a compressive layer (FIG. 10D). Additionally, a lattice matched $GaAs_yP_{1-y}$ on unstrained $Si_{0.35}Ge_{0.65}$ sample and compressive-tensile structure were grown as control samples. Plan view TEM data reveals that tensile strain in only the $Si_{1-x}Ge_x$ virtual substrate yielded the best quality $GaAs_yP_{1-y}$ films (see FIG. 11, with the result labeled "T-SiGe")—better than the previous best tensile-compressive zone sample and substantially better than a completely unstrained structure. The compressive strain capped $Si_{1-x}Ge_x$ virtual substrate exhibited a large increase in threading dislocation density (see FIG. 11, with the result labeled "C—SiGe"), which reinforces our results that any compressive strain at the interface without a tensile layer leads to an increase in defect density.

Figure 10C:
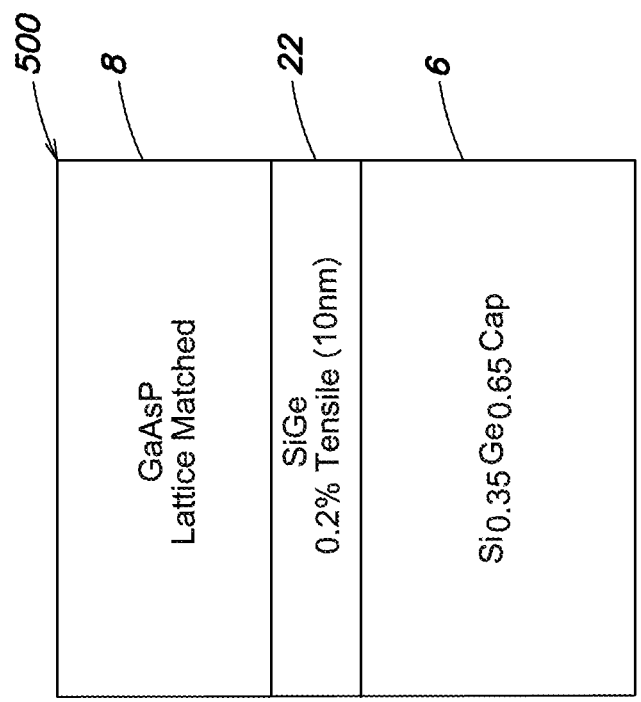

FIG. 10C shows an embodiment of a semiconductor structure 500 having a region of SiGe semiconductor material 6, a region of tensilely-strained SiGe semiconductor material 22 and a region of GaAsP semiconductor material 8. As shown in FIG. 10C, in this embodiment region 22 is formed between regions 6 and 8. Region 8 may be lattice-matched to region 6. In some embodiments, regions 8 and 6 may each be relaxed (unstrained). The techniques described herein are not limited to a strain of 0.2% in region 22. In some embodiments, the strain of region 22 may be 0.1% to 0.3%, 0.1% to 0.5% or 0.1% to 1%. In some embodiments, the strain may be smaller or larger than these values. In some embodiments, the average strain of region 22 across the wafer may be 0.2%, 0.1% to 0.3%, 0.1% to 0.5% or 0.1% to 1%. Further, the techniques described herein are not limited as to particular thickness for the regions shown in FIG. 10C. Strained region 22 may have a thickness smaller than the critical thickness for defect formation. Further, any suitable compositions of SiGe semiconductor material and GaAsP semiconductor material may be used in the regions shown in FIG. 10C.

FIG. 11 shows a plot illustrating the TDD obtained based on use of the initiation conditions and the strain engineering experiments described above. In FIG. 11, results labeled "Initiation Conditions" are shown without the introduction of a strained layer. Results labeled "Strain Conditions" are shown with III-V growth initiation having been performed using a three second exposure to AsH$_3$.

FIG. 11 also shows the TDD of a current SiGe virtual substrate (~$10^6$cm$^{-2}$). The quality of virtual $Si_{1-x}Ge_x$ substrates is expected to be continuously improved with time as well, as indicated in FIG. 11, as further development and commercialization occurs. Thus, with the techniques described herein, the use of initiating $Si_{1-x}Ge_x$ films with a short As exposure, followed by the use of tensile layers near the heterovalent interface, will result in even lower threading dislocation densities in the $Si_{1-x}Ge_x$ films as the quality of SiGe virtual substrates improves.

We have developed initiation and strain-engineering techniques at the $GaAs_yP_{1-y}/Si_{1-x}Ge_x$ heterovalent interface to prevent high defect densities. Such techniques enable forming III-V materials over silicon substrates, the III-V materials being suitable for the formation of III-V devices. Any suitable III-V devices may be formed, such as electronic and/or optoelectronic devices. III-V devices may be formed in a layer of GaAsP material or a layer of another semiconductor material (e.g., another III-V semiconductor material) overlying the region of GaAsP material. The use of such techniques will allow a plethora of III-V devices to be integrated over silicon substrates, such as visible $In_zGa_{1-z}$ P LEDs and multi-junction solar cells, for example.

As used herein, the term "GaAsP semiconductor material" includes $GaAs_yP_{1-y}$ in which each of gallium, arsenic and phosphorous is present, and y is greater than zero and less than one. The term "GaAsP semiconductor material" does not encompass GaAs without phosphorous or GaP without arsenic. The term "GaAsP semiconductor material" does not exclude additional materials from being present in addition to gallium, arsenic and phosphorous. For example, a GaAsP semiconductor material may include material(s) in addition to gallium, arsenic and phosphorous such group III element(s) (e.g., aluminum, indium, etc. and/or group V element(s) (e.g., nitrogen).

As used herein, the term "SiGe semiconductor material" includes $Si_{1-x}Ge_x$ in which each of silicon and germanium are present, and x is greater than zero and less than one. The term "SiGe semiconductor material" does not encompass silicon without germanium or germanium without silicon. The term "SiGe semiconductor material" does not exclude additional materials from being present.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A semiconductor structure, comprising:
    a first semiconductor region comprising a GaAsP semiconductor material;
    a second semiconductor region comprising a SiGe semiconductor material; and
    at least one strained semiconductor region between the first semiconductor region and the second semiconductor region, the at least one strained semiconductor region comprising a GaAsP semiconductor material and/or a SiGe semiconductor material, the at least one strained semiconductor region comprising a tensilely-strained semiconductor region,
    wherein the tensilely-strained semiconductor region has a strain of no greater than approximately 0.2%.

2. The semiconductor structure of claim 1, wherein the first semiconductor region has a lattice constant matched to that of the second semiconductor region.

3. The semiconductor structure of claim 2, wherein the second semiconductor region is unstrained.

4. The semiconductor structure of claim 1, wherein the tensilely-strained semiconductor region has a thickness that is less than a critical thickness for defect formation.

5. The semiconductor structure of claim 1, wherein the tensilely-strained semiconductor region comprises a GaAsP semiconductor material.

6. The semiconductor structure of claim 1, wherein the tensilely-strained semiconductor region comprises a SiGe semiconductor material.

7. The semiconductor structure of claim 1, wherein the at least one strained semiconductor region comprises a GaAsP semiconductor material and a SiGe semiconductor material.

8. The semiconductor structure of claim 1, wherein the at least one strained semiconductor region is at an interface between the first semiconductor region and the second semiconductor region.

9. The semiconductor structure of claim 1, wherein the at least one strained semiconductor region further comprises a compressively-strained semiconductor region.

10. The semiconductor structure of claim 9, wherein the tensilely-strained semiconductor region comprises a GaAsP semiconductor material and the compressively-strained semiconductor region comprises a GaAsP semiconductor material.

11. The semiconductor structure of claim 10, further comprising a region of GaAsP semiconductor material lattice-matched to the second semiconductor region and being between the at least one strained semiconductor region and the second semiconductor region.

12. The semiconductor structure of claim 9, wherein the tensilely-strained semiconductor region comprises a SiGe semiconductor material and the compressively-strained semiconductor region comprises a GaAsP semiconductor material, the tensilely-strained semiconductor region being between the compressively-strained semiconductor region and the second semiconductor region.

13. The semiconductor structure of claim 1, wherein the first semiconductor region has a threading dislocation density of no greater than $10^6$ cm$^{-2}$.

14. A semiconductor structure, comprising:
    a first semiconductor region comprising a GaAsP semiconductor material;
    a second semiconductor region comprising a SiGe semiconductor material; and
    at least one strained semiconductor region between the first semiconductor region and the second semiconductor region, the at least one strained semiconductor region comprising a GaAsP semiconductor material and/or a SiGe semiconductor material, the at least one strained semiconductor region comprising a tensilely-strained semiconductor region,
    wherein the at least one strained semiconductor region further comprises a compressively-strained semiconductor region, and
    wherein the tensilely-strained semiconductor region comprises a SiGe semiconductor material and the compressively-strained semiconductor region comprises a GaAsP semiconductor material, the tensilely-strained semiconductor region being between the compressively-strained semiconductor region and the second semiconductor region.

15. The semiconductor structure of claim 14, wherein the first semiconductor region has a lattice constant matched to that of the second semiconductor region.

16. The semiconductor structure of claim 14, wherein the second semiconductor region is unstrained.

17. The semiconductor structure of claim 14, wherein the tensilely-strained semiconductor region has a thickness that is less than a critical thickness for defect formation.

18. The semiconductor structure of claim 14, wherein the first semiconductor region has a threading dislocation density of no greater than $10^6$ cm$^{-2}$.

* * * * *